US010580467B2

(12) United States Patent
Iijima

(10) Patent No.: US 10,580,467 B2
(45) Date of Patent: Mar. 3, 2020

(54) MEMORY INTERFACE AND MEMORY SYSTEM INCLUDING PLURALITY OF DELAY ADJUSTMENT CIRCUITS SHARED BY MEMORY READ AND WRITE CIRCUITS FOR ADJUSTING THE TIMING OF READ AND WRITE DATA SIGNALS

(71) Applicant: TOSHIBA MEMORY CORPORATION, Tokyo (JP)

(72) Inventor: Hiroaki Iijima, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/114,177

(22) Filed: Aug. 27, 2018

(65) Prior Publication Data
US 2019/0287585 A1 Sep. 19, 2019

(30) Foreign Application Priority Data
Mar. 16, 2018 (JP) .................................. 2018-050133

(51) Int. Cl.
G11C 7/00 (2006.01)
G11C 7/10 (2006.01)
G06F 13/16 (2006.01)

(52) U.S. Cl.
CPC ........ G11C 7/1096 (2013.01); G06F 13/1673 (2013.01); G11C 7/10 (2013.01); G11C 7/1006 (2013.01)

(58) Field of Classification Search
CPC .. G11C 7/1096; G11C 7/1006; G06F 13/1673

USPC .................. 365/189.16, 189.04, 194, 230.02
See application file for complete search history.

(56) References Cited

U.S. PATENT DOCUMENTS

| 7,589,557 | B1 | 9/2009 | Bergendahl et al. |
| 8,406,065 | B2 | 3/2013 | Mochizuki |
| 2001/0049797 | A1* | 12/2001 | Mullarkey ................ G06F 5/06 713/401 |
| 2010/0246294 | A1* | 9/2010 | Chuang ..................... G11C 7/22 365/194 |
| 2012/0188833 | A1* | 7/2012 | Yamahara ............ G11C 7/1072 365/193 |

(Continued)

FOREIGN PATENT DOCUMENTS

| JP | 2007-249738 A | 9/2007 |
| JP | 2009-009238 A | 1/2009 |

*Primary Examiner* — Connie C Yoha
(74) *Attorney, Agent, or Firm* — Kim & Stewart LLP

(57) ABSTRACT

A memory interface includes a first output circuit to be connected to the memory device for communication therewith, a first input circuit to be connected to the memory device for communication therewith, a first write circuit configured to process write data, a read circuit configured to process read data and a read strobe, a first delay adjustment circuit, a first switching circuit which is connected in a signal path between the first write circuit and the first delay adjustment circuit, and in a signal path between the first input circuit and the first delay adjustment circuit, and a second switching circuit which is connected in a signal path between the first delay adjustment circuit and the first output circuit, and in a signal path between the first delay adjustment circuit and the read circuit.

20 Claims, 11 Drawing Sheets

(56) References Cited

U.S. PATENT DOCUMENTS

2013/0342254 A1* 12/2013 Mazumder ............ H03H 11/26
327/276

* cited by examiner

MEMORY INTERFACE AND MEMORY SYSTEM INCLUDING PLURALITY OF DELAY ADJUSTMENT CIRCUITS SHARED BY MEMORY READ AND WRITE CIRCUITS FOR ADJUSTING THE TIMING OF READ AND WRITE DATA SIGNALS

CROSS-REFERENCE TO RELATED APPLICATIONS

This application is based upon and claims the benefit of priority from Japanese Patent Application No. 2018-050133, filed Mar. 16, 2018, the entire contents of which are incorporated herein by reference.

FIELD

An embodiment described herein relates generally to a memory interface and a memory system.

BACKGROUND

A memory interface, which is capable of being connected to a memory device, adjusts a delay amount of a signal output to the memory device and adjusts a delay amount of a signal input from the memory device. It is desired that the memory interface is small in area.

DETAILED DESCRIPTION

An embodiment provides a memory interface and a memory system which can easily reduce an area of a memory interface.

In general, according to one embodiment, there is provided a memory interface which includes a first output circuit to be connected to the memory device for communication therewith, a first input circuit to be connected to the memory device for communication therewith, a first write circuit configured to process write data, a read circuit configured to process read data and a read strobe, a first delay adjustment circuit, a first switching circuit which is connected in a signal path between the first write circuit and the first delay adjustment circuit, and in a signal path between the first input circuit and the first delay adjustment circuit, and a second switching circuit which is connected in a signal path between the first delay adjustment circuit and the first output circuit, and in a signal path between the first delay adjustment circuit and the read circuit.

Hereinafter, a memory interface and a memory system according to embodiments will be described with reference to the accompanying drawings. Further, the present disclosure is not limited to the embodiments.

Embodiment

Figure 1:
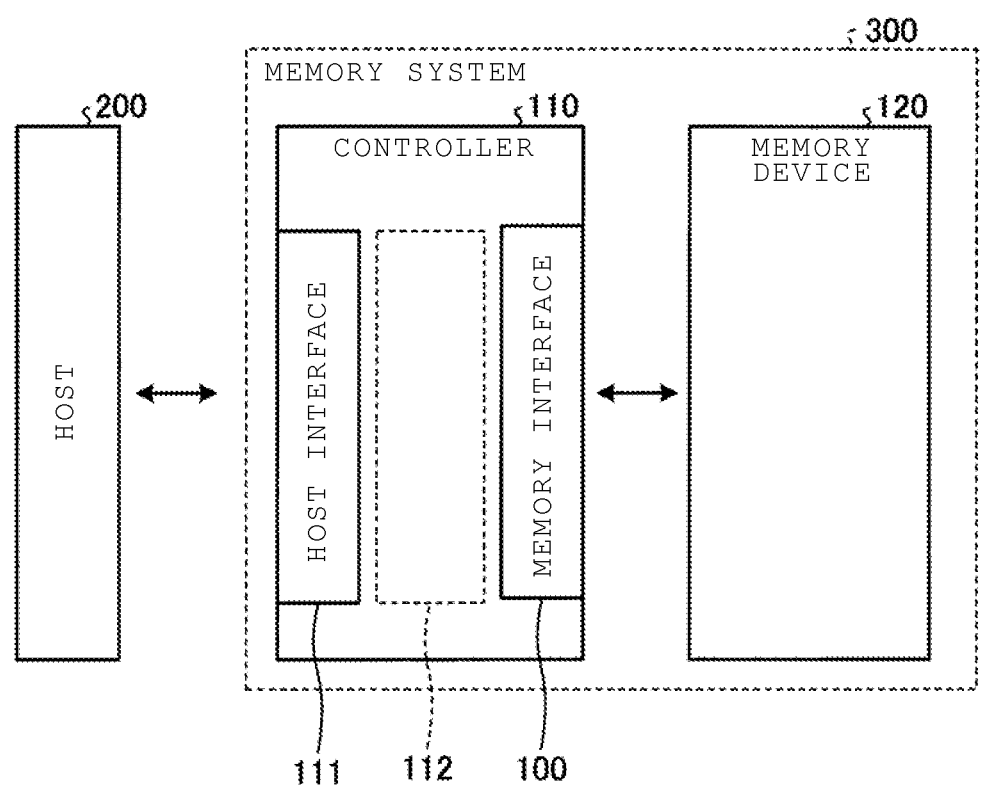
FIG. 1 is a diagram illustrating a configuration of a memory system to which a memory interface according to an embodiment is applied.

A memory interface 100 according to an embodiment is an interface to access a memory device 120 in a parallel manner. For example, the memory interface 100 may be applied to a memory system 300 illustrated in FIG. 1. FIG. 1 is a diagram illustrating a configuration of the memory system 300 to which the memory interface 100 according to the embodiment is applied.

The memory system 300 is able to be connected to a host 200, and may serve as an external storage medium of the host 200. The host 200 is, for example, a personal computer. The memory system 300 is, for example, an SSD. The memory system 300 includes a controller 110 and the memory device 120. The controller 110 includes a host interface 111, a signal processing circuit 112, and the memory interface 100. The memory device 120 may be a volatile semiconductor memory (for example, a DRAM), or may be a nonvolatile semiconductor memory (for example, a NAND flash memory).

The memory interface 100 is disposed between an internal circuit (for example, the signal processing circuit 112) of the controller 110 and the memory device 120, and performs an interface operation between the internal circuit and the memory device 120. The memory interface 100 transmits write data supplied from the internal circuit to the memory device 120, or transfers read data received from the memory device 120 to the internal circuit.

The memory interface 100 adjusts skews of the write data and/or a strobe signal (hereinafter, referred to as strobe) such that an edge timing of the strobe is near the center of a period of a data valid window where a level of the write data is stabilized, and transmits the write data and/or a strobe having their skews adjusted, to the memory device 120. With this configuration, a timing margin of setup-and-hold of the write data can be secured. The write data can be fetched in synchronization with the strobe in the memory device 120 at a transmission destination.

In addition, the memory interface 100 adjusts skews of the read data and/or the strobe such that the edge timing of the strobe is near the center of a period of a data valid window where a level of the read data is stabilized, and transmits the read data and/or a strobe having their skews adjusted to the internal circuit. With this configuration, a timing margin of setup-and-hold of the read data can be secured. The read data can be fetched in synchronization with the strobe in the internal circuit at a transfer destination.

Figure 2:
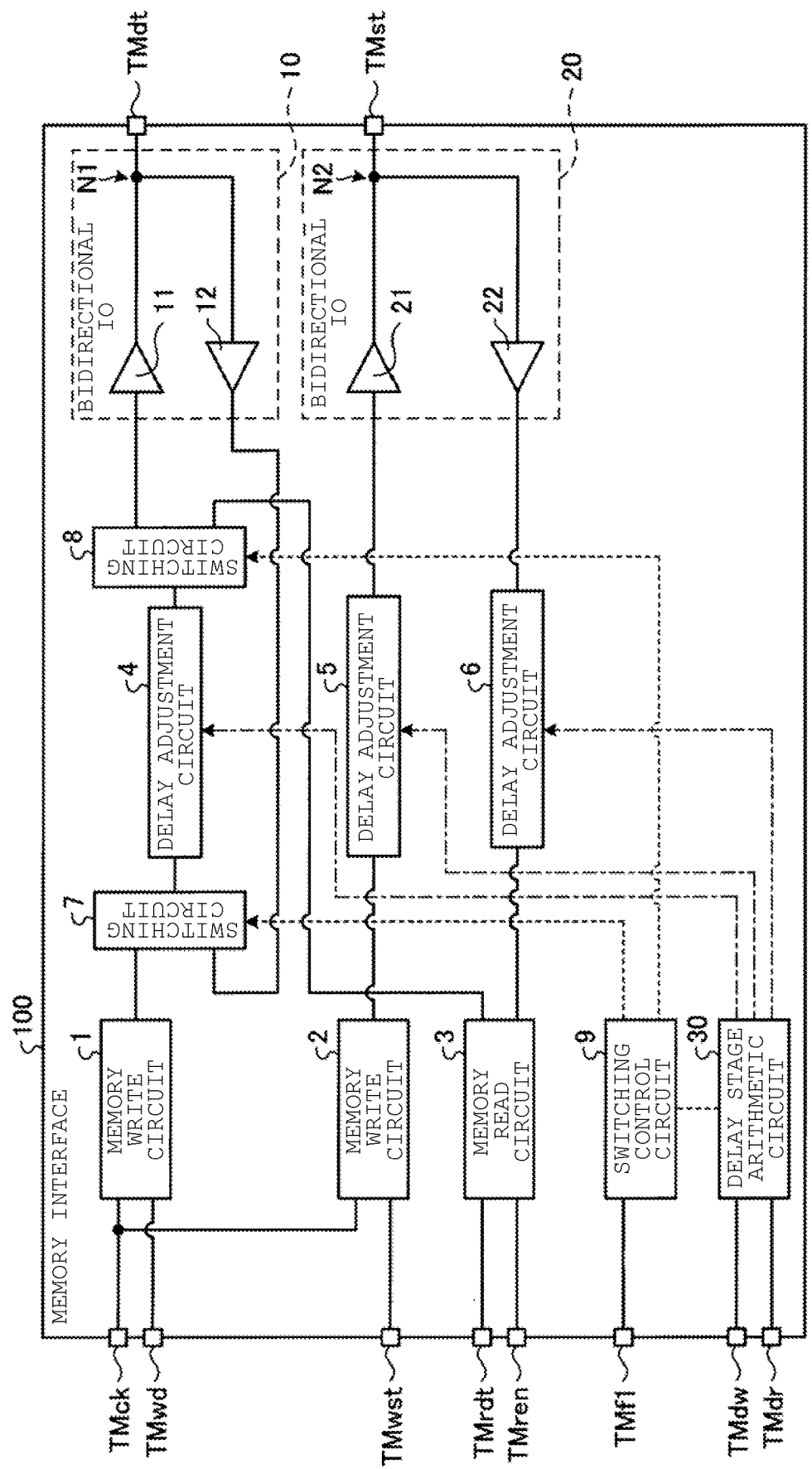
FIG. 2 is a diagram illustrating a configuration of the memory interface according to the embodiment.

The memory interface 100 may be configured as illustrated in FIG. 2, for example. FIG. 2 is a diagram illustrating an example of a configuration of the memory interface 100 according to the embodiment. The memory interface 100 employs a bidirectional bus system, and includes memory write circuits 1 and 2 and a memory read circuit 3. In FIG. 2, each line is illustrated by one line for the sake of simplicity of the drawing. However, each line may be formed as a transmission line containing a plurality of bits. In other words, the memory interface 100 may be configured to adjust a skew of 1 bit or skews of a plurality of bits.

In the memory interface 100, the memory write circuits 1 and 2 and the memory read circuit 3 are operated to notify a write access timing and a read access timing. When dedicated delay adjustment circuits are mounted, a circuit area is easily increased.

Therefore, in this embodiment, a delay adjustment circuit 4 is shared by the memory write circuit 1 and the memory read circuit 3 in the memory interface in order to reduce the circuit area.

Specifically, in the memory interface 100, the delay adjustment circuit 4 is shared by the memory write circuit 1 and the memory read circuit 3, and the circuit that uses the delay adjustment circuit 4 can be selected. In normal time, anyone of the memory write circuit 1 and the memory read circuit 3 is selected, and an appropriate delay setting is performed, so that the memory access is enabled. In a case where there is a need to switch the memory access direction, the memory access is switched to any one of the memory write circuit 1 and the memory read circuit 3, and the delay setting is changed to the appropriate delay setting in a state where input or output of the delay adjustment circuit 4 is masked as needed. Then, the input or the output of the delay adjustment circuit 4 is masked off, so that the memory access can be made in the other direction without causing a malfunction in association with the switching. For this reason, switching circuits 7 and 8 related to the delay adjustment circuit 4 are mounted in the memory interface 100.

More specifically, the memory interface 100 includes, as illustrated in FIG. 2, the memory write circuit 1, the memory write circuit 2, the memory read circuit 3, the delay adjustment circuit 4, a delay adjustment circuit 5, a delay adjustment circuit 6, the switching circuit 7, the switching circuit 8, a switching control circuit 9, a bidirectional IO circuit 10, a bidirectional IO circuit 20, and a delay stage arithmetic circuit 30. In addition, the memory interface 100 includes a data terminal TMdt, a strobe terminal TMst, a clock terminal TMck, a write data terminal TMwd, a write strobe terminal TMwst, a read data terminal TMrdt, a read data enable terminal TMren, a write/read flag terminal TMfl, a write-delay setting terminal TMdw, and a read-delay setting terminal TMdr.

The bidirectional IO circuit 10 includes an output buffer 11 and an input buffer 12. An input side of the output buffer 11 is connected to the switching circuit 8, and an output side thereof is connected to the data terminal TMdt via a node N1. An input side of the input buffer 12 is connected to the data terminal TMdt via the node N1, and an output side thereof is connected to the switching circuit 7. In the data terminal TMdt, the data terminal of the memory device 120 may be connected via a bidirectional bus. The output buffer 11 can transmit the write data transferred from the switching circuit 8 to the memory device 120 via the node N1, the data terminal TMdt, and the bidirectional bus. The input buffer 12 can receive the read data from the memory device 120 via the bidirectional bus, the data terminal TMdt, and the node N1, and transfer the read data to the switching circuit 7.

The bidirectional IO circuit 20 includes an output buffer 21 and an input buffer 22. An input side of the output buffer 21 is connected to the delay adjustment circuit 5, and an output side thereof is connected to the strobe terminal TMst via a node N2. An input side of the input buffer 22 is connected to the strobe terminal TMst via the node N2, and an output side thereof is connected to the delay adjustment circuit 6. In the strobe terminal TMst, the strobe terminal of the memory device 120 may be connected via the bidirectional bus. The output buffer 21 can transmit a write strobe transferred from the delay adjustment circuit 5 to the memory device 120 via the node N2, the strobe terminal TMst, and the bidirectional bus. The input buffer 22 can receive read strobe from the memory device 120 via the bidirectional bus, the strobe terminal TMst, and the node N2, and transfer the read strobe to the delay adjustment circuit 6.

An input side of the memory write circuit 1 is connected to the clock terminal TMck and the write data terminal TMwd, and an output side thereof is connected to the switching circuit 7. The memory write circuit 1 processes the write data and outputs the write data to the switching circuit 7. The memory write circuit 1 includes a latch circuit, for example. The memory write circuit 1 latches the write data received through the write data terminal TMwd by rising or falling of a clock received through the clock terminal TMck as a trigger, and outputs the write data to the switching circuit 7.

An input side of the memory write circuit 2 is connected to the clock terminal TMck and the write strobe terminal TMwst, and an output side thereof is connected to the delay adjustment circuit 5. The memory write circuit 2 processes the write strobe and outputs the write strobe to the delay adjustment circuit 5. The memory write circuit 2 includes a latch circuit for example. The memory write circuit 2 latches the write strobe received through the write strobe terminal TMwst by rising or falling of a clock received through the clock terminal TMck as a trigger, and outputs the write strobe to the delay adjustment circuit 5.

An input side of the memory read circuit 3 is connected to the switching circuit 8 and the delay adjustment circuit 6, and an output side thereof is connected to the read data terminal TMrdt and the read data enable terminal TMren. The memory read circuit 3 processes the read data and outputs the read data to the read data terminal TMrdt, and processes the read strobe and outputs the read strobe to the read data enable terminal TMren. The memory read circuit 3 outputs the read data transferred from the switching circuit 8 toward the signal processing circuit 112 through the read data terminal TMrdt, and outputs the read strobe transferred from the delay adjustment circuit 6 toward the signal processing circuit 112 through the read data enable terminal TMren.

The delay adjustment circuit 4 is disposed on the output side of the memory write circuit 1. An input side of the delay adjustment circuit 4 is connected to the switching circuit 7, and an output side thereof is connected to the switching circuit 8. In a case where the write data is transferred from the switching circuit 7, the delay adjustment circuit 4 assigns a first delay amount to the write data and transfers the write data to the switching circuit 8. In a case where the read data is transferred from the switching circuit 7, the delay adjustment circuit 4 assigns a second delay amount to the read data and transfers the read data to the switching circuit 8. The delay adjustment circuit 4 includes a plurality of stages of delay elements. The first delay amount and the second delay amount may be set individually by different registers, for example.

The delay adjustment circuit 5 is disposed on the output side of the memory write circuit 2. An input side of the delay adjustment circuit 5 is connected to the memory write circuit 2, and an output side thereof is connected to the output buffer 21. In a case where the write strobe is transferred from the memory write circuit 2, the delay adjustment circuit 5 assigns a third delay amount to the write strobe and transfers the write strobe to the output buffer 21. The delay adjustment circuit 5 includes a plurality of stages of delay elements.

The delay adjustment circuit 6 is disposed on the output side of the input buffer 22. An input side of the delay adjustment circuit 6 is connected to the input buffer 22, and an output side thereof is connected to the memory read circuit 3. In a case where the read strobe is transferred from the input buffer 22, the delay adjustment circuit 6 assigns a fourth delay amount to the read strobe and transfers the read strobe to the memory read circuit 3. The delay adjustment circuit 6 includes a plurality of stages of delay elements.

The delay stage arithmetic circuit 30 is disposed on a side opposite to the output buffer 11 with respect to the delay adjustment circuit 4. An input side of the delay stage arithmetic circuit 30 is connected to the write-delay setting terminal TMdw and the read-delay setting terminal TMdr, and an output side thereof is connected to the delay adjustment circuits 4 to 6. The delay stage arithmetic circuit 30 may be configured such that the number of stages of delay elements corresponding to a desired delay amount is obtained in advance and the delay adjustment circuits 4 to 6 are set to perform the delay operation by the stage number. The delay stage arithmetic circuit 30 obtains a first delay stage number corresponding to the first delay amount in the delay adjustment circuit 4 according to a control signal received through the write-delay setting terminal TMdw, and sets the delay adjustment circuit 4 to perform the delay operation by the first delay stage number. In addition, the delay stage arithmetic circuit 30 obtains a third delay stage number corresponding to the third delay amount in the delay adjustment circuit 5 according to the control signal received through the write-delay setting terminal TMdw, and sets the delay adjustment circuit 5 to perform the delay operation by the third delay stage number. The delay stage arithmetic circuit 30 obtains a second delay stage number corresponding to the second delay amount in the delay adjustment circuit 4 according to the control signal received through the read-delay setting terminal TMdr, and sets the delay adjustment circuit 4 to perform the delay operation by the second delay stage number. In addition, the delay stage arithmetic circuit 30 obtains a fourth delay stage number corresponding to the fourth delay amount in the delay adjustment circuit 6 according to the control signal received through the read-delay setting terminal TMdr, and sets the delay adjustment circuit 6 to perform the delay operation by the fourth delay stage number.

The switching circuit 7 is electrically connected between the memory write circuit 1 and the delay adjustment circuit 4, and also electrically connected between the input buffer 12 and the delay adjustment circuit 4. The switching circuit 7 performs switching according to the control signal received from the switching control circuit 9 between a state (e.g., first state) where the memory write circuit 1 is electrically connected to the delay adjustment circuit 4 and a state (e.g., second state) where the input buffer 12 is electrically connected to the delay adjustment circuit 4. In the case of being switched to the first state, the switching circuit 7 can transfer the write data transferred from the memory write circuit 1 to the delay adjustment circuit 4. In the case of being switched to the second state, the switching circuit 7 can transfer the read data transferred from the input buffer 12 to the delay adjustment circuit 4. The circuit size of the switching circuit 7 is small compared to the circuit size of the delay adjustment circuit 4.

The switching circuit 8 is electrically connected between the delay adjustment circuit 4 and the output buffer 11, and also electrically connected between the delay adjustment circuit 4 and the memory read circuit 3. The switching circuit 8 performs switching according to the control signal received from the switching control circuit 9 between a state (e.g., third state) where the delay adjustment circuit 4 is electrically connected to the output buffer 11 and a state (e.g., fourth state) where the delay adjustment circuit 4 is electrically connected to the memory read circuit 3. In the case of being switched to the third state, the switching circuit 8 can transfer the write data assigned with the first delay amount by the delay adjustment circuit 4 to the output buffer 11. In the case of being switched to the fourth state, the switching circuit 8 can transfer the read data assigned with the second delay amount by the delay adjustment circuit 4 to the memory read circuit 3. The circuit size of the switching circuit 8 is small compared to the circuit size of the delay adjustment circuit 4.

The input side of the switching control circuit 9 is connected to the write/read flag terminal TMfl, and the output side thereof is connected to the switching circuit 7 and the switching circuit 8. In a case where a flag received through the write/read flag terminal TMfl indicates write, the switching control circuit 9 controls the switching circuit 7 to perform switching to the first state and controls the switching circuit 8 to perform switching to the third state. In a case where the flag received through the write/read flag terminal TMfl indicates read, the switching control circuit 9 controls the switching circuit 7 to perform switching to the second state and controls the switching circuit 8 to perform switching to the fourth state.

As described above, in the memory interface 100 according to the embodiment, both the delay amount of the write data and the delay amount of the read data are assigned by the switching of the switching circuits 7 and 8 in the delay adjustment circuit 4. With this configuration, the delay adjustment circuit 4 is shared by the memory write circuit 1 and the memory read circuit 3. As a result, the circuit area of the memory interface 100 can be reduced compared to a case where the delay adjustment circuit for the write data and the delay adjustment circuit for the read data are provided separately.

In addition, in the memory interface 100 according to the embodiment, the delay adjustment circuit 4 is shared by the memory write circuit 1 and the memory read circuit 3. Therefore, the number of operating delay adjustment circuits can be reduced. With this configuration, the power consumption of the memory interface 100 can be reduced compared to a case where the delay adjustment circuit for the write data and the delay adjustment circuit for the read data are provided separately.

Further, in a memory interface 100*i*, a component for performing a built-in self-test (BIST) operation may be added in a configuration where the delay adjustment circuit 4 is shared by the memory write circuit 1 and the memory read circuit 3.

Figure 3:
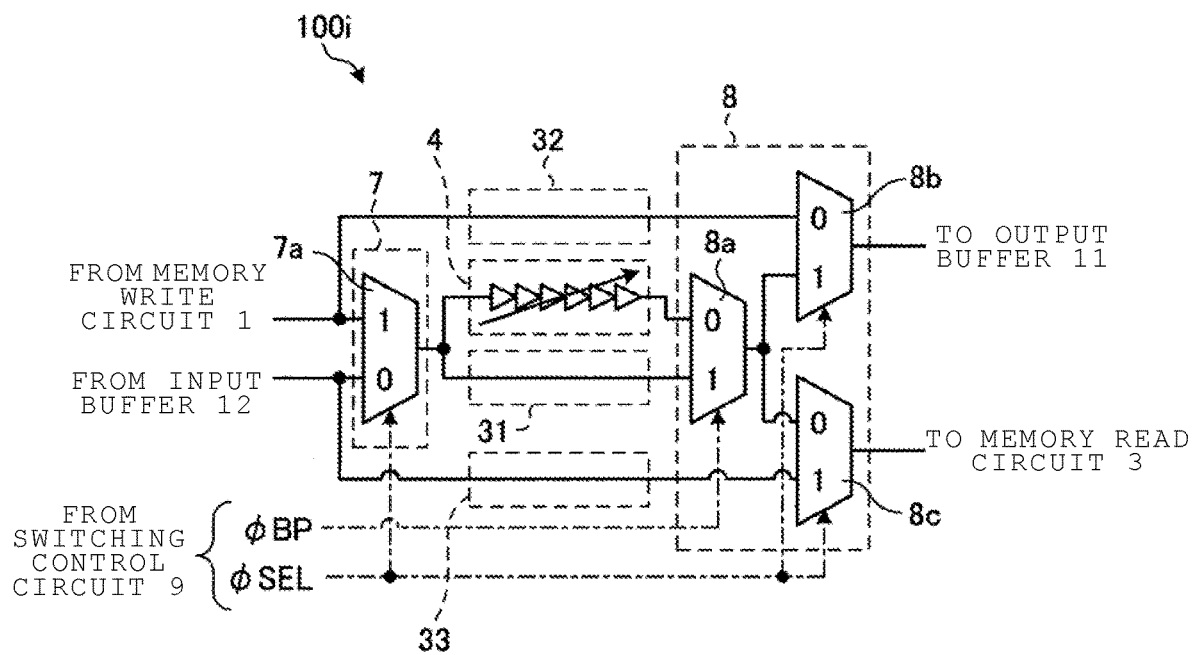
FIG. 3 is a diagram illustrating a built-in self-test operation in a first modification of the embodiment.

For example, the memory interface 100*i* may be configured as illustrated in FIG. 3. FIG. 3 is a diagram illustrating a built-in self-test operation in a first modification of the embodiment. The memory interface 100*i* further includes a bypass line 31, a bypass line 32, and a bypass line 33. The bypass line 31 is electrically connected between the switching circuit 7 and the switching circuit 8 in parallel to the delay adjustment circuit 4, and electrically connected between the switching circuit 7 and the switching circuit 8 to bypass the delay adjustment circuit 4. The bypass line 32 is electrically connected between the memory write circuit 1 and the switching circuit 8 in parallel to the switching circuit 7 and the delay adjustment circuit 4, and electrically connected between the memory write circuit 1 and the switching circuit 8 to bypass the switching circuit 7 and the delay adjustment circuit 4. The bypass line 33 is electrically connected between the input buffer 12 and the switching circuit 8 in parallel to the switching circuit 7 and the delay adjustment circuit 4, and electrically connected between the input buffer 12 and the switching circuit 8 to bypass the switching circuit 7 and the delay adjustment circuit 4.

The switching circuit 7 includes a selector 7*a*. The selector 7*a* includes a first input node "0" which is connected to the input buffer 12, a second input node "1" which is connected to the memory write circuit 1, and an output node which is connected to the input side of the delay adjustment circuit 4 and one end of the bypass line 31. The selector 7*a* receives a select signal φSEL as a control signal from the switching control circuit 9, selects the first input node "0" during a period when the select signal φSEL is 0 to electrically connect the input buffer 12 to the output node, and selects the second input node "1" during a period when the select signal φSEL is 1 to electrically connect the memory write circuit 1 to the output node.

The switching circuit 8 includes a selector 8*a*, a selector 8*b*, and a selector 8*c*. The selector 8*a* includes a first input node "0" which is connected to the output side of the delay adjustment circuit 4, a second input node "1" which is connected to the other end of the bypass line 31, and an output node which is connected to the selector 8*b* and the selector 8*c*. The selector 8*a* receives a bypass signal φBP as a control signal from the switching control circuit 9, selects the first input node "0" during a period when the bypass signal φBP is 0 to electrically connect the output side of the delay adjustment circuit 4 to the output node, and selects the second input node "1" during a period when the bypass signal φBP is 1 to electrically connect the other end of the bypass line 31 to the output node.

The selector 8*b* includes a first input node "0" which is connected to the bypass line 32, a second input node "1" which is connected to the output node of the selector 8*a*, and an output node which is connected to the output buffer 11. The selector 8*b* receives the select signal φSEL as a control signal from the switching control circuit 9, selects the first input node "0" during a period when the select signal φSEL is 0 to electrically connect the bypass line 32 to the output node, and selects the second input node "1" during a period when the select signal φSEL is 1 to electrically connect the output node of the selector 8*a* to the output node of the selector 8*b*.

The selector 8*c* includes a first input node "0" which is connected to the output node of the selector 8*a*, a second input node "1" which is connected to the bypass line 33, and an output node which is connected to the memory read circuit 3. The selector 8*c* receives the select signal φSEL as a control signal from the switching control circuit 9, selects the first input node "0" during a period when the select signal φSEL is 0 to electrically connect the output node of the selector 8*a* to the output node of the selector 8*c*, and selects the second input node "1" during a period when the select signal φSEL is 1 to electrically connect the bypass line 33 to the output node.

Figure 4:
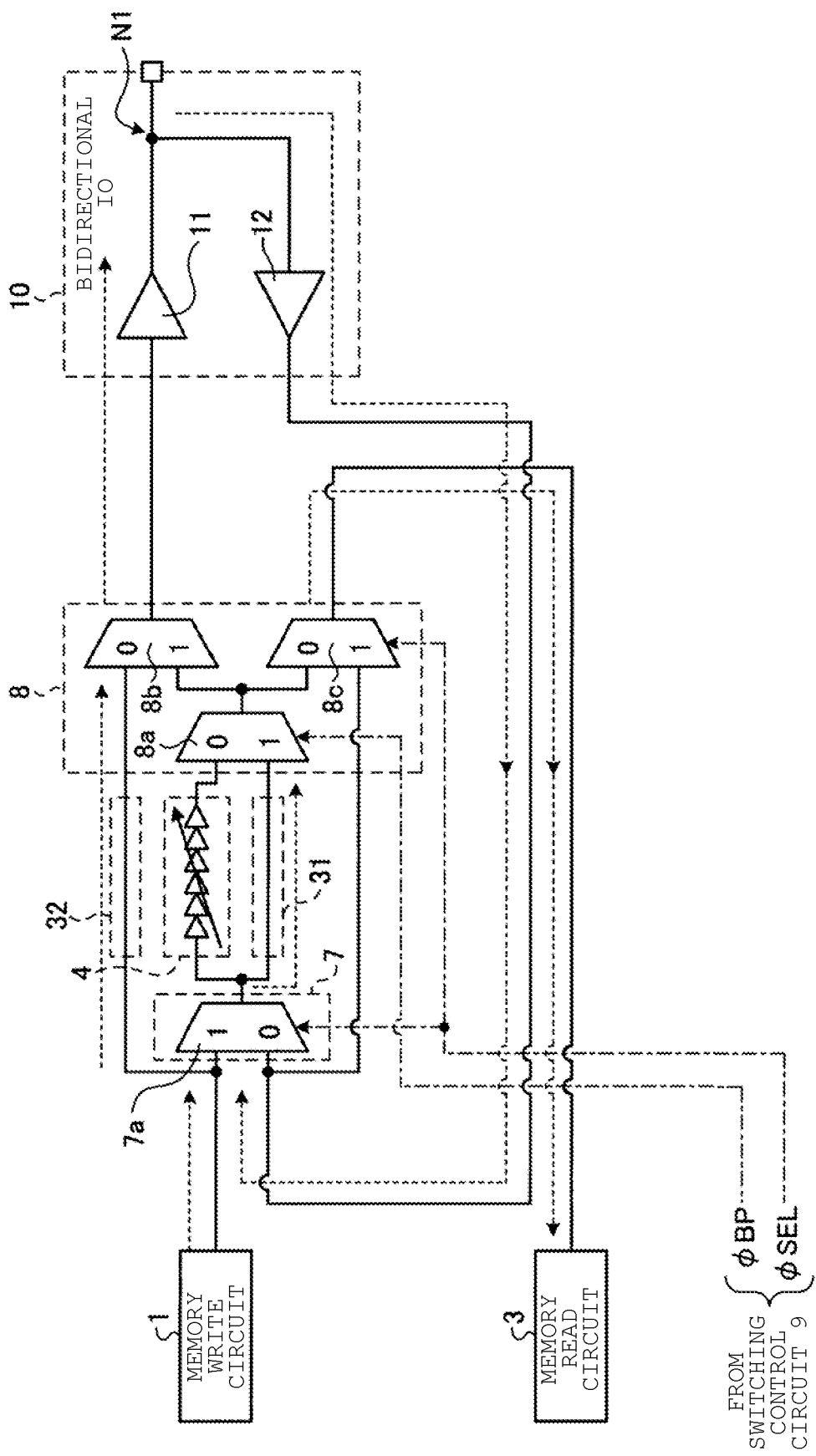
FIG. 4 is a diagram illustrating the built-in self-test operation in the first modification of the embodiment.

The built-in self-test (BIST) operation may be performed as illustrated in FIG. 4 by supplying the select signal φSEL of 0 and the bypass signal φBP of 1 from the switching control circuit 9, for example. FIG. 4 is a diagram illustrating the built-in self-test operation in the first modification of the embodiment. The built-in self-test operation may be performed by control of the signal processing circuit 112, for example (see FIG. 1). The built-in self-test operation may be performed in a non-connected state where the memory device 120 is not connected. Test data which is transferred from the signal processing circuit 112 to the memory write circuit 1 through the write data terminal TMwd is transferred along the bypass line 32→the switching circuit 8 (in particular, the selector 8*b*)→the output buffer 11→the node N1→the input buffer 12→the switching circuit 7 (in particular, the selector 7*a*)→the bypass line 31→the switching circuit 8 (in particular, the selector 8*a*→the selector 8*c*)→the memory read circuit 3→the read data terminal TMrdt→the signal processing circuit 112 as depicted by dashed arrows in FIG. 4. The signal processing circuit 112 compares a value of the transferred test data with an expected value, determines that there is no error when the two values are matched, and determines that there is an error such as an open circuit in the memory interface 100*i* when the two values are not matched.

In this way, the memory interface 100*i* is configured to perform the built-in self-test operation. Therefore, the memory interface 100*i* can diagnose a failure, and can notify the error (for example, an error display using an LED or the like).

Figure 5:
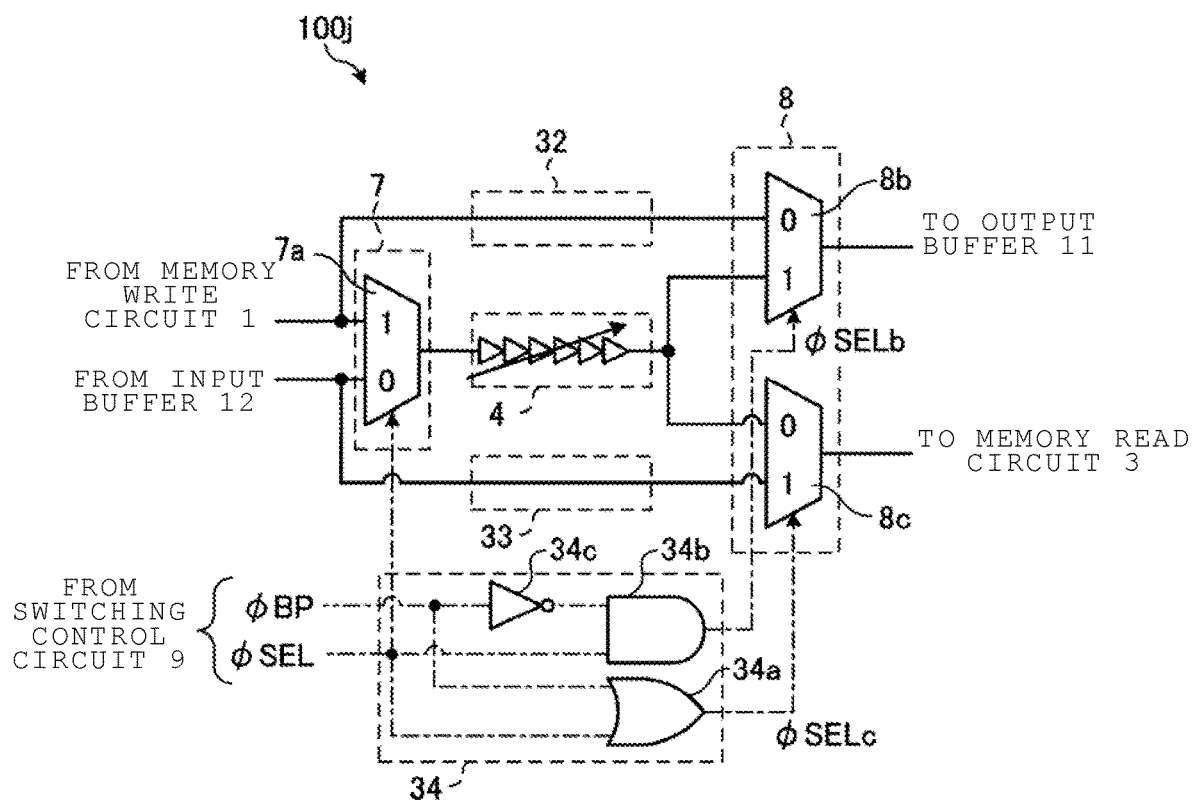
FIG. 5 is a diagram illustrating a built-in self-test operation in a second modification of the embodiment.

Alternatively, a memory interface 100*j* may be configured as illustrated in FIG. 5 for the built-in self-test operation. FIG. 5 is a diagram illustrating a configuration for the built-in self-test operation in a second modification of the embodiment.

As illustrated in FIG. 5, the memory interface 100*j* has a configuration in which a timing adjustment circuit 34 is added to the configuration illustrated in FIG. 4 while omitting the bypass line 31 and the selector 8*a* in the switching circuit 8. The timing adjustment circuit 34 may be configured to adjust the timing of the select operation between the selector 7*a* and the selectors 8*b* and 8*c*, and to perform a similar operation as that of the built-in self-test operation illustrated in FIG. 4.

The timing adjustment circuit 34 includes an OR gate 34*a*, an AND gate 34*b*, and an inverter 34*c*. The OR gate 34*a* calculates a logical sum between the bypass signal φBP and the select signal φSEL, and supplies the calculation result to the selector 8*c* as a select signal φSELc. The AND gate 34*b* calculates a logical product between a signal obtained by logically inverting the bypass signal φBP by the inverter 34*c* and the select signal φSEL, and supplies the calculation result to the selector 8*b* as a select signal φSELb.

The selector 8*b* includes the first input node "0" which is connected to the bypass line 32, the second input node "1" which is connected to the output side of the delay adjustment circuit 4, and the output node which is connected to the output buffer 11. The selector 8*b* receives the select signal φSELb from the timing adjustment circuit 34, selects the first input node "0" during a period when the select signal φSELb is 0 to electrically connect the bypass line 32 to the output node, and selects the second input node "1" during a period when the select signal φSELb is 1 to electrically connect the output side of the delay adjustment circuit 4 to the output node of the selector 8b.

The selector 8c includes the first input node "0" which is connected to the output side of the delay adjustment circuit 4, the second input node "1" which is connected to the bypass line 33, and the output node which is connected to the memory read circuit 3. The selector 8c receives the select signal φSELc from the timing adjustment circuit 34, selects the first input node "0" during a period when the select signal φSELc is 0 to electrically connect the output side of the delay adjustment circuit 4 to the output node of the selector 8c, and selects the second input node "1" during a period when the select signal φSELc is 1 to electrically connect the bypass line 33 to the output node. For example, by setting φBP to 0 and φSEL to 0, a path of the memory write circuit 1→the bypass line 32→the selector 8b (0)→the output buffer 11→the input buffer 12→the selector 7a (0)→the delay adjustment circuit 4→the selector 8c (0)→the memory read circuit 3 can be set.

In this way, the memory interface 100j is configured to perform the built-in self-test operation. Therefore, the memory interface 100j can diagnose a failure, and can notify the error (for example, an error display using an LED or the like).

Figure 6:
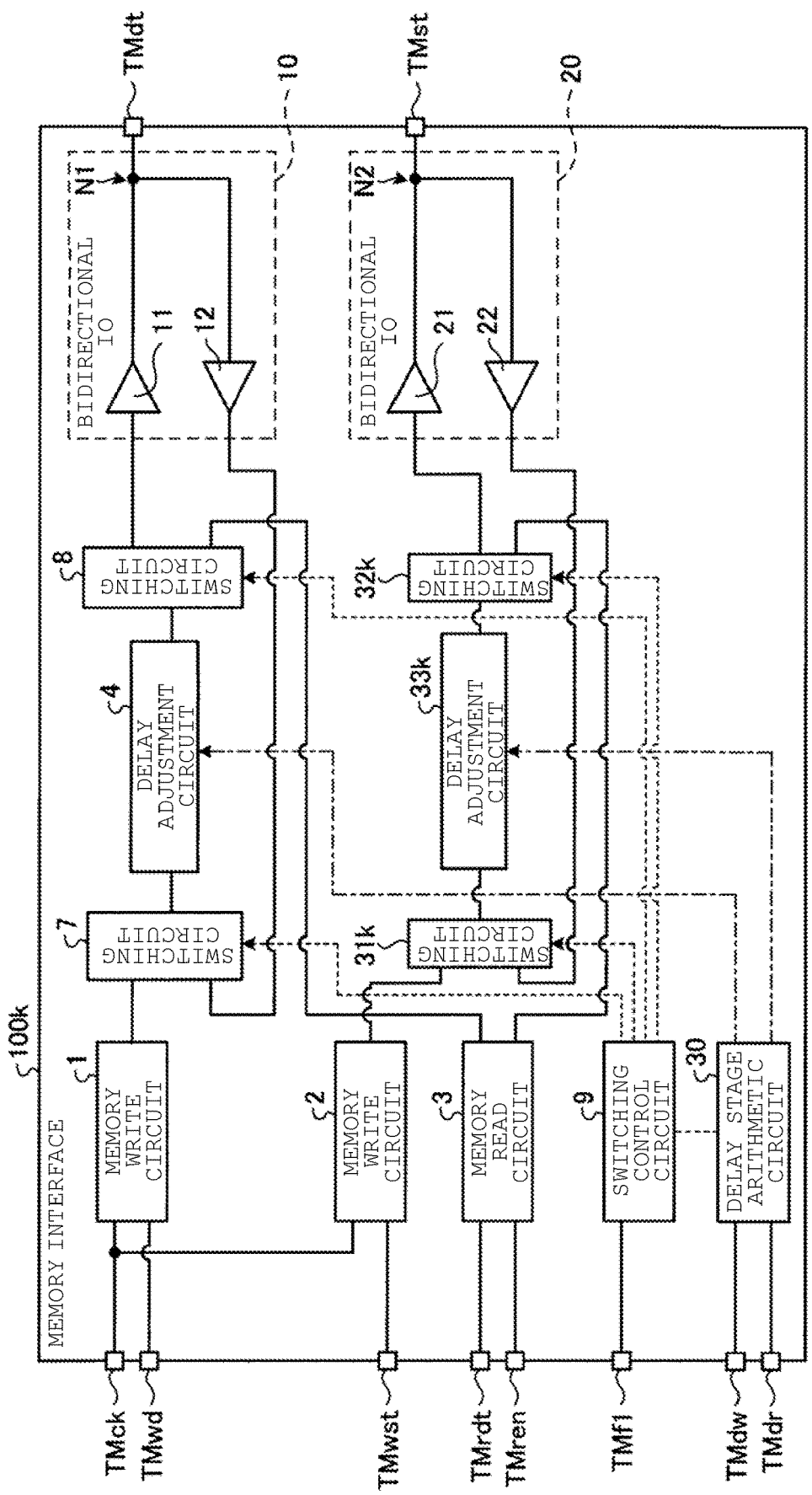
FIG. 6 is a diagram illustrating a configuration of a memory interface according to a third modification of the embodiment.

Alternatively, in a memory interface 100k, components for further reducing the circuit area may be added. For example, the memory interface 100k may be configured as illustrated in FIG. 6. FIG. 6 is a diagram illustrating a configuration of the memory interface 100k according to a third modification of the embodiment.

As illustrated in FIG. 6, the memory interface 100k is configured such that the delay adjustment circuit 5 and the delay adjustment circuit 6 illustrated in FIG. 2 are shared as a delay adjustment circuit 33k, and a switching circuit 31k and a switching circuit 32k are added.

The delay adjustment circuit 33k is disposed on the output side of the memory write circuit 2. The input side of the delay adjustment circuit 33k is connected to the switching circuit 31k, and the output side thereof is connected to the switching circuit 32k. In a case where the write strobe is transferred from the switching circuit 31k, the delay adjustment circuit 33k assigns the third delay amount to the write strobe and transfers the write strobe to the switching circuit 32k. In a case where the read strobe is transferred from the switching circuit 31k, the delay adjustment circuit 33k assigns the fourth delay amount to the read strobe and transfers the read strobe to the switching circuit 32k. The delay adjustment circuit 33k includes a plurality of stages of delay elements. The number of stages of delay elements in the delay adjustment circuit 33k may be set to a stage number corresponding to the number of stages of delay elements in the delay adjustment circuit 5 (see FIG. 2) and the number of stages of delay elements in the delay adjustment circuit 6 (see FIG. 2). The third delay amount and the fourth delay amount may be set individually using different registers, for example.

The switching circuit 31k is electrically connected between the memory write circuit 2 and the delay adjustment circuit 33k, and also electrically connected between the input buffer 22 and the delay adjustment circuit 33k. The switching circuit 31k performs switching according to the control signal received from the switching control circuit 9 between a state (e.g., fifth state) where the memory write circuit 2 is electrically connected to the delay adjustment circuit 33k and a state (e.g., sixth state) where the input buffer 22 is electrically connected to the delay adjustment circuit 33k. In the case of being switched to the fifth state, the switching circuit 31k can transfer the write strobe transferred from the memory write circuit 2 to the delay adjustment circuit 33k. In the case of being switched to the sixth state, the switching circuit 31k can transfer the read strobe transferred from the input buffer 22 to the delay adjustment circuit 33k. The circuit size of the switching circuit 31k is small compared to the circuit size of the delay adjustment circuit 33k.

The switching circuit 32k is electrically connected between the delay adjustment circuit 33k and the output buffer 21, and also electrically connected between the delay adjustment circuit 33k and the memory read circuit 3. The switching circuit 32k performs switching according to the control signal received from the switching control circuit 9 between a state (e.g., seventh state) where the delay adjustment circuit 33k is electrically connected to the output buffer 21 and a state (e.g., eighth state) where the delay adjustment circuit 33k is electrically connected to the memory read circuit 3. In the case of being switched to the seventh state, the switching circuit 32k can transfer the write strobe assigned with the third delay amount by the delay adjustment circuit 33k to the output buffer 21. In the case of being switched to the eighth state, the switching circuit 32k can transfer the read strobe assigned with the fourth delay amount by the delay adjustment circuit 33k to the memory read circuit 3. The circuit size of the switching circuit 32k is small compared to the circuit size of the delay adjustment circuit 33k.

In this way, in the memory interface 100k, both the delay amount to the write strobe and the delay amount of the read strobe are assigned by the switching of the switching circuits 31k and 32k in the delay adjustment circuit 33k. With this configuration, the delay adjustment circuit 33k is shared by the memory write circuit 2 and the memory read circuit 3. As a result, as illustrated in FIG. 2, the circuit area of the memory interface 100k can be reduced compared to a case where the delay adjustment circuit 5 for the write strobe and the delay adjustment circuit 6 for the read strobe are provided separately.

Figure 7:
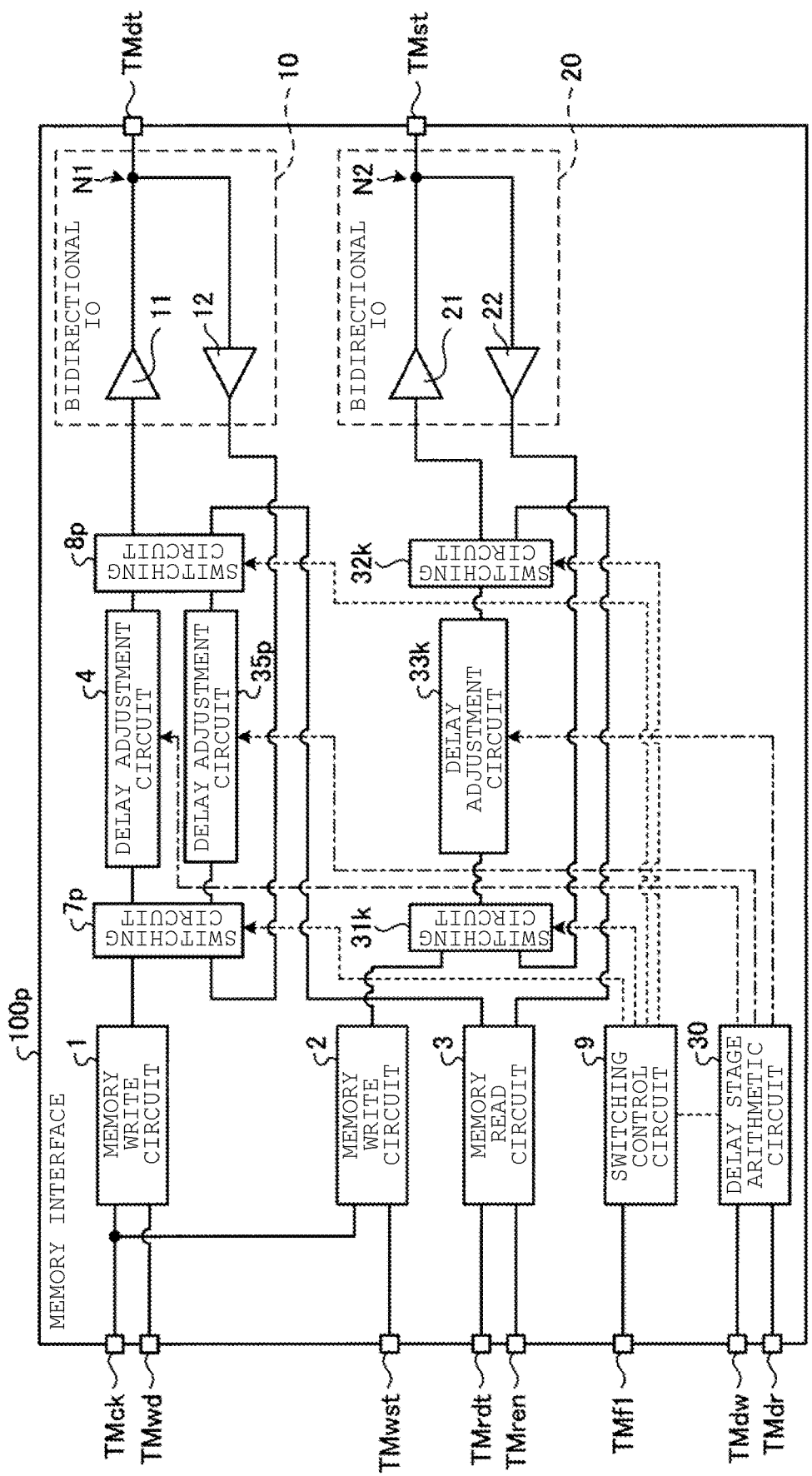
FIG. 7 is a diagram illustrating a configuration of a memory interface according to a fourth modification of the embodiment.

Alternatively, in a memory interface 100p, a component for updating the delay setting during memory access may be added. For example, the memory interface 100p is configured as illustrated in FIG. 7. FIG. 7 is a diagram illustrating a configuration of the memory interface 100p according to a fourth modification of the embodiment.

As illustrated in FIG. 7, the memory interface 100p is configured to add a delay adjustment circuit 35p to the configuration illustrated in FIG. 6. The delay adjustment circuit 35p is electrically connected between a switching circuit 7p and a switching circuit 8p in parallel to the delay adjustment circuit 4. The delay adjustment circuit 35p is disposed on the output side of the memory write circuit 1. The input side of the delay adjustment circuit 35p is connected to the switching circuit 7p, and the output side thereof is connected to the switching circuit 8p. The delay adjustment circuit 35p includes a plurality of stages of delay elements. Further, the configuration of the delay adjustment circuit 35p may be the same as that of the delay adjustment circuit 4.

Figure 8:
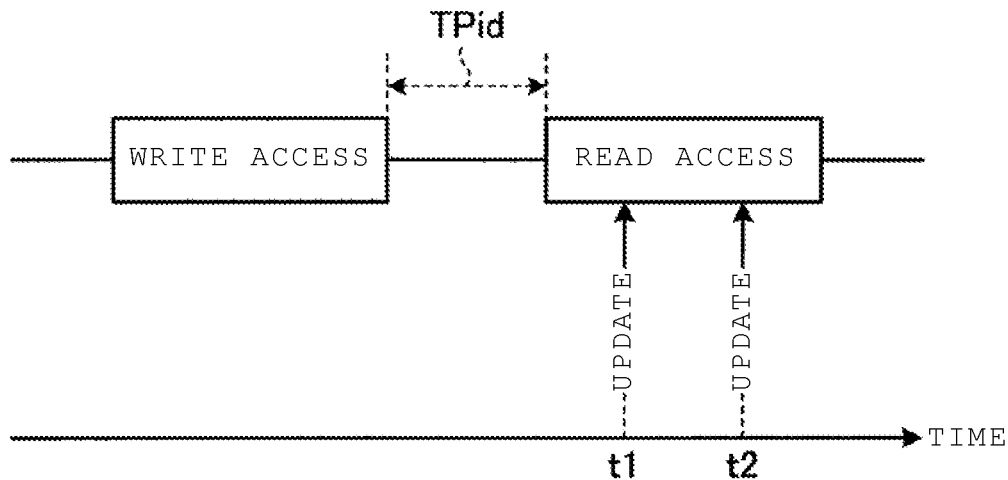
FIG. 8 is a timing chart illustrating an operation of the memory interface according to the fourth modification of the embodiment.

In the memory interface 100p, for example, as illustrated in FIG. 8, there is an idle period TPid from the end of a write access operation to the memory device 120 to the start of a read access operation. The delay stage arithmetic circuit 30 may set the delay amount to the delay adjustment circuit 4 by changing the setting from the write operation setting to the read operation setting during the idle period TPid. However, there may be a need to update the delay amount during the read access (timing t1 and t2 in FIG. 8) such as a case where retry read operation is performed with a high reliability setting due to a read error, for example.

Figure 9:
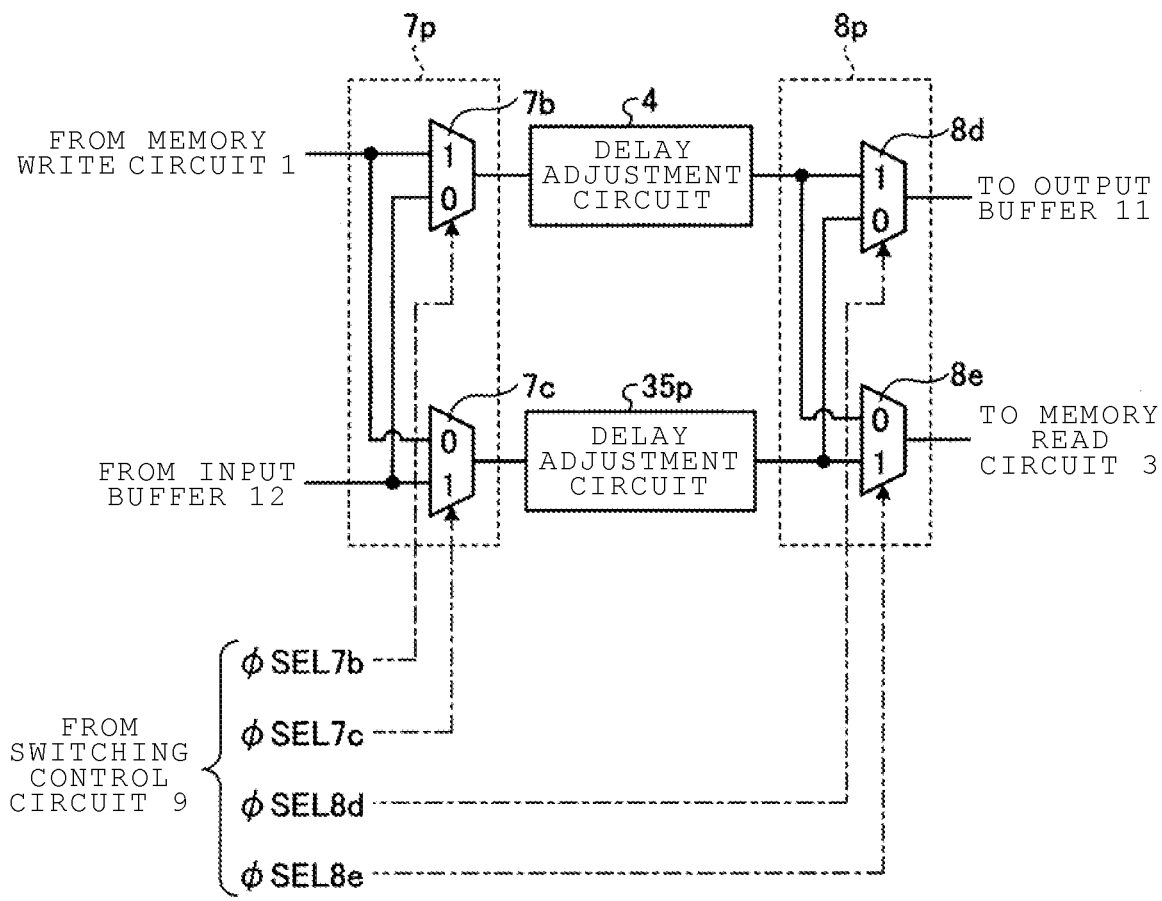
FIG. 9 is a diagram illustrating an internal configuration of switching circuits in the fourth modification of the embodiment.

Therefore, as illustrated in FIG. 7, the delay adjustment circuit 4 and the delay adjustment circuit 35p are connected in parallel between the switching circuit 7p and the switching circuit 8p, and one of the delay adjustment circuit 4 and the delay adjustment circuit 35p is used in a normal delay assignment while the update setting of the delay amount is performed using the other one. At this time, the switching circuit 7p and the switching circuit 8p may be configured as illustrated in FIG. 9. FIG. 9 is a diagram illustrating an internal configuration of the switching circuits 7p and 8p.

The switching circuit 7p illustrated in FIG. 9 includes a selector 7b and a selector 7c. The selector 7b includes a first input node "0" which is connected to the input buffer 12, a second input node "1" which is connected to the memory write circuit 1, and an output node which is connected to the input side of the delay adjustment circuit 4. The selector 7b receives a select signal ϕSEL7b as a control signal from the switching control circuit 9, selects the first input node "0" during a period when the select signal ϕSEL7b is 0 to electrically connect the input buffer 12 to the output node, and selects the second input node "1" during a period when the select signal ϕSEL7b is 1 to electrically connect the memory write circuit 1 to the output node.

The selector 7c includes a first input node "0" which is connected to the memory write circuit 1, a second input node "1" which is connected to the input buffer 12, and an output node which is connected to the input side of the delay adjustment circuit 35p. The selector 7c receives a select signal ϕSEL7c as a control signal from the switching control circuit 9, selects the first input node "0" during a period when the select signal ϕSEL7c is 0 to electrically connect the memory write circuit 1 to the output node, and selects the second input node "1" during a period when the select signal ϕSEL7c is 1 to electrically connect the input buffer 12 to the output node.

The switching circuit 8p illustrated in FIG. 9 includes a selector 8d and a selector 8e. The selector 8d includes a first input node "0" which is connected to the delay adjustment circuit 35p, a second input node "1" which is connected to the delay adjustment circuit 4, and an output node which is connected to the output buffer 11. The selector 8d receives a select signal ϕSEL8d as a control signal from the switching control circuit 9, selects the first input node "0" during a period when the select signal ϕSEL8d is 0 to electrically connect the delay adjustment circuit 35p to the output node, and selects the second input node "1" during a period when the select signal ϕSEL8d is 1 to electrically connect the delay adjustment circuit 4 to the output node.

The selector 8e includes a first input node "0" which is connected to the delay adjustment circuit 4, a second input node "1" which is connected to the delay adjustment circuit 35p, and an output node which is connected to the memory read circuit 3. The selector 8e receives a select signal ϕSEL8e as a control signal from the switching control circuit 9, selects the first input node "0" during a period when the select signal ϕSEL8e is 0 to electrically connect the delay adjustment circuit 4 to the output node, and selects the second input node "1" during a period when the select signal ϕSEL8e is 1 to electrically connect the delay adjustment circuit 35p to the output node.

Figure 10A:
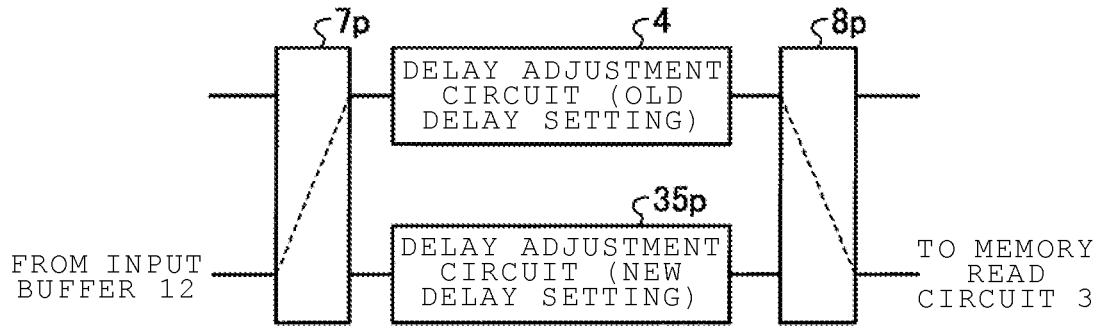
FIGS. 10A to 10C are diagrams illustrating a switching operation in the fourth modification of the embodiment.
Figure 10B:
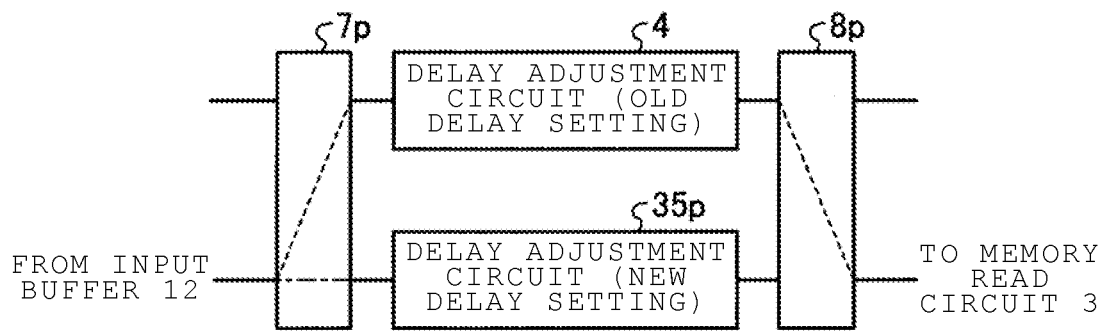
Figure 10C:
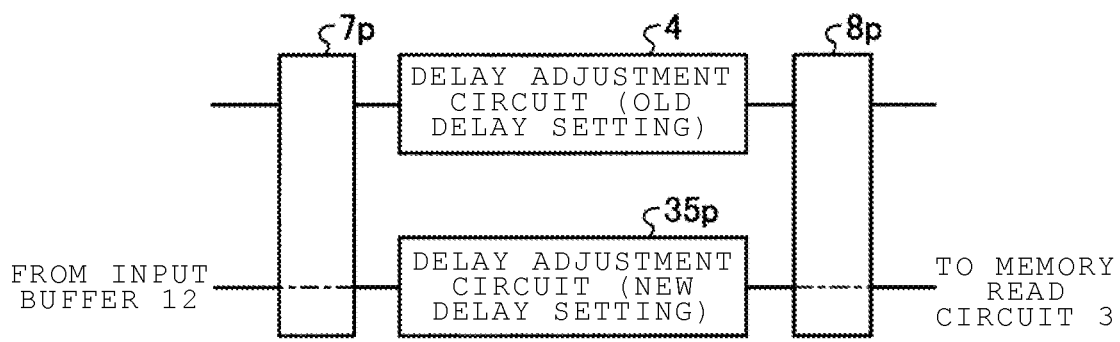

The switching circuit 7p and the switching circuit 8p can be switched at independent timing by the configuration illustrated in FIG. 9 in which the switching circuit 7p and the switching circuit 8p are switched by the separate select signals. With this configuration, as illustrated in FIGS. 10A to 10C, a switching operation can be made to switch the switching circuit 8p after the switching circuit 7p is switched. FIGS. 10A to 10C are diagrams illustrating the switching operation in the fourth modification of the embodiment.

For example, by assignment of a delay amount to the read data as illustrated in FIG. 10A, the delay stage arithmetic circuit 30 performs new delay setting to set a new delay amount on the delay adjustment circuit 35p in a state where the old delay setting in which an old delay amount is set is performed on the delay adjustment circuit 4. At this time, as depicted by broken lines in FIG. 10A, the switching circuit 7p connects the input buffer 12 to the delay adjustment circuit 4, and the switching circuit 8p connects the delay adjustment circuit 4 to the memory read circuit 3.

At a timing before a predetermined time from timing t1 (see FIG. 8), the switching circuit 7p also connects the input buffer 12 to the delay adjustment circuit 35p as depicted by a chain line in FIG. 10B in a state where the input buffer 12 is connected to the delay adjustment circuit 4 as depicted by the broken line in FIG. 10A. At this time, the switching circuit 8p remains in a state where the delay adjustment circuit 4 is selectively connected to the memory read circuit 3 as depicted by the chain line in FIG. 10B. The predetermined time may be experimentally acquired as a time until noise artifacts in the delay adjustment circuit 35p are stabilized since the switching depicted by the chain line in FIG. 10B is performed.

At timing t1, the switching circuit 8p selectively connects the delay adjustment circuit 35p to the memory read circuit 3 in a state where the switching circuit 7p selectively connects the input buffer 12 to the delay adjustment circuit 35p, as depicted by chain lines in FIG. 10C. With this configuration, the delay amount is assigned to the read data by a new delay amount on the delay adjustment circuit 35p subjected to a new delay setting.

In this way, in the memory interface 100p, the delay adjustment circuit 35p is additionally inserted between the switching circuit 7p and the switching circuit 8p in parallel to the delay adjustment circuit 4, so that the delay amount during memory access can be updated. Therefore, a timing closure is easily made where a timing path delay is converged in a predetermined timing range.

In addition, the switching circuit 7p and the switching circuit 8p are configured to be independently switched. Therefore, a circuit used to assign the delay amount can be switched at an appropriate timing between the delay adjustment circuit 4 and the delay adjustment circuit 35p. With this configuration, the switching operation can be performed such that the switching circuit 8p is switched after the switching circuit 7p is switched. Therefore, it is possible to prevent noise artifacts due to the switching.

Figure 11:
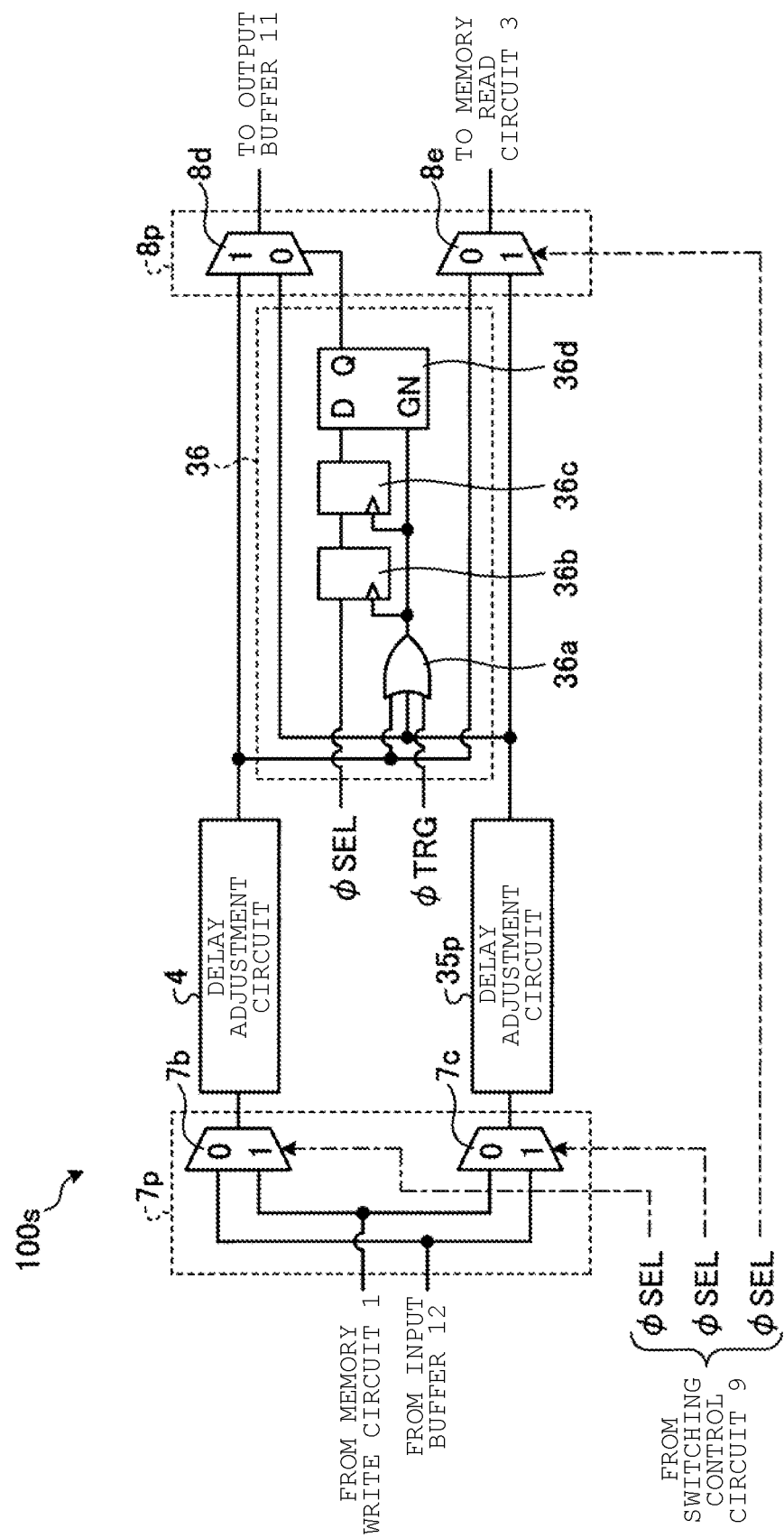
FIG. 11 is a diagram illustrating a configuration of switching circuits and delay adjustment circuits in a fifth modification of the embodiment.

Alternatively, in a memory interface 100s, the switching operation may be realized with a configuration illustrated in FIG. 11 such that the switching circuit 8p is switched after the switching circuit 7p is switched. FIG. 11 is a diagram illustrating a configuration of the switching circuit and the delay adjustment circuit in a fifth modification of the embodiment.

As illustrated in FIG. 11, the memory interface 100s is configured such that a timing adjustment circuit 36 is electrically connected between the delay adjustment circuits 4 and 35p and the switching circuit 8 compared to the configuration illustrated in FIG. 7. The timing adjustment circuit 36 includes an OR gate 36a, a flip-flop 36b, a flip-flop 36c, and a latch circuit 36d. The OR gate 36a calculates a logical sum of the output of the delay adjustment circuit 4, the output of the delay adjustment circuit 35p, and a trigger signal φTRG, and supplies the signal to the clock terminals of the flip-flop 36b, the flip-flop 36c, and the latch circuit 36d. The flip-flop 36b holds the select signal φSEL in synchronization with a rising edge of the output of the OR gate 36a, and outputs the select signal to the flip-flop 36c. The flip-flop 36c holds the select signal φSEL from the flip-flop 36b in synchronization with a rising edge of the output of the OR gate 36a, and outputs the select signal to the latch circuit 36d. The latch circuit 36d is a low-through latch circuit. The latch circuit 36d transfers the level of the output of the flip-flop 36c as a select signal to the selector 8d during a period when the output of the OR gate 36a is at an L level. The latch circuit 36d holds the level of the output of the flip-flop 36c at timing from L level to H level, and outputs the level held during a period when the output of the OR gate 36a is at the H level as a select signal to the selector 8d.

The timing adjustment circuit 36 can generate a select signal (=the output of the latch circuit 36d) such that the switching circuit 8p is switched after the switching circuit 7p is switched according to changes in the output of the delay adjustment circuit 4 and the output of the delay adjustment circuit 35p using the select signal φSEL which is shared among the selectors 7b, 7c, and 8e during memory access. In addition, when switching at an idle time, the switching may be made using the trigger signal φTRG from outside.

Figure 12:
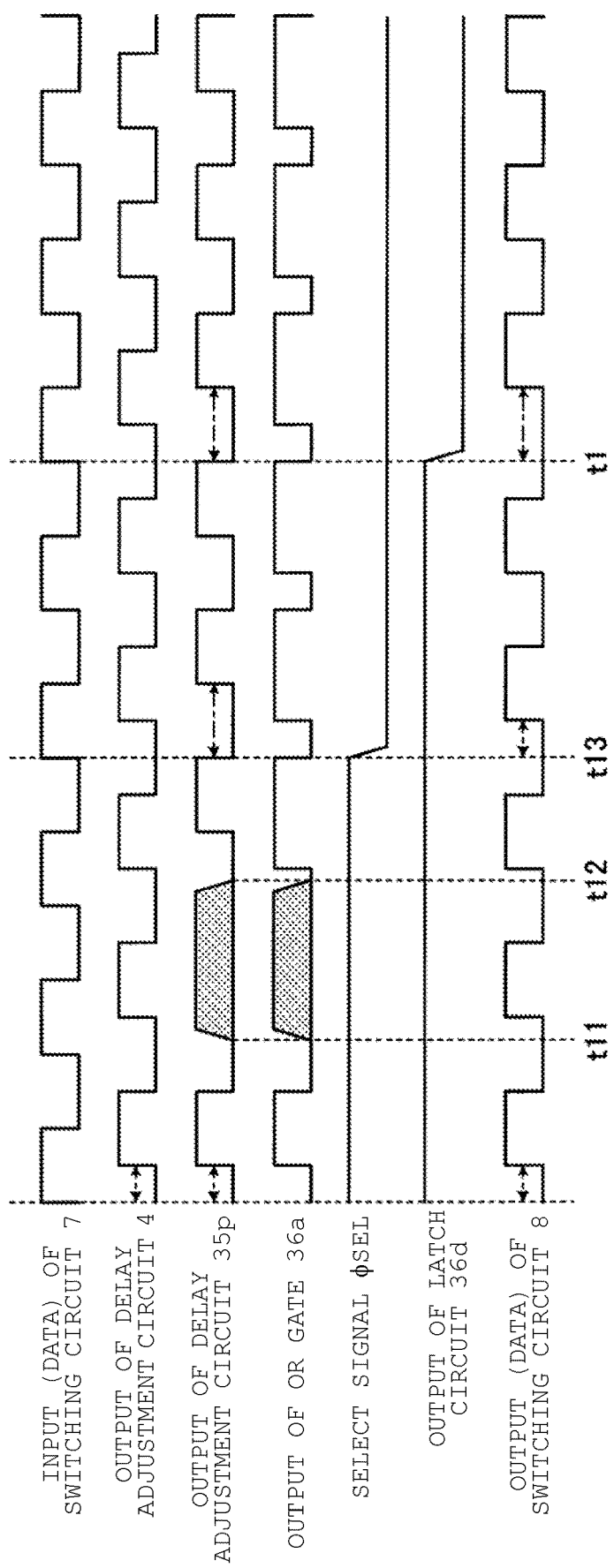
FIG. 12 is a waveform diagram illustrating an operation of a memory interface in the fifth modification of the embodiment.

With the configuration illustrated in FIG. 11, the memory interface 100s operates as illustrated in FIG. 12, for example. FIG. 12 is a waveform diagram illustrating an operation of the memory interface 100s in the fifth modification of the embodiment.

For example, during a period of timing t11 to t12, the delay stage arithmetic circuit 30 performs a new delay setting to set a new delay amount on the delay adjustment circuit 35p in a state where the assignment of the delay amount to the write data causes the old delay setting to set an old delay amount to perform on the delay adjustment circuit 4. At this time, according to the select signal φSEL of 1, the switching circuit 7p connects the memory write circuit 1 to the delay adjustment circuit 4, and the switching circuit 8p connects the delay adjustment circuit 4 to the output buffer 11 (see FIG. 11).

At timing t13 before a predetermined time from timing t1 (see FIG. 8), the switching circuit 7p connects the memory write circuit 1 to the delay adjustment circuit 35p when the select signal φSEL becomes "0". At this time, since the select signal (the output of the latch circuit 36d) remains at "1", the switching circuit 8p remains in a state where the delay adjustment circuit 4 is connected to the output buffer 11. The predetermined time may be experimentally acquired as a time until noise artifacts in the delay adjustment circuit 35p are stabilized after the switching at timing t13 is performed.

At timing t1, the select signal (the output of the latch circuit 36d) becomes "0". Therefore, the switching circuit 8p connects the delay adjustment circuit 35p to the output buffer 11. With this configuration, the delay amount is assigned to the write data by a new delay amount on the delay adjustment circuit 35p subjected to a new delay setting.

In this way, in the memory interface 100s, the switching operation can be performed such that the switching circuit 8p is switched after the switching circuit 7p is switched. Therefore, it is possible to prevent glitches from occurring along the switching.

In addition, in a case where data is a plurality of bits, a combination of the switching circuit 7, the delay adjustment circuit 4, and the switching circuit 8 may be provided for each bit of the data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory interface for connection with a memory device, comprising:
a first output circuit to be connected to the memory device for communication therewith;
a first input circuit to be connected to the memory device for communication therewith;
a first write circuit configured to process write data;
a read circuit configured to process read data and a read strobe;
a first delay adjustment circuit;
a first switching circuit which is connected in a signal path between the first write circuit and the first delay adjustment circuit, and in a signal path between the first input circuit and the first delay adjustment circuit; and
a second switching circuit which is connected in a signal path between the first delay adjustment circuit and the first output circuit, and in a signal path between the first delay adjustment circuit and the read circuit.

2. The memory interface according to claim 1, further comprising:
a second delay adjustment circuit which is connected in a signal path between the first switching circuit and the second switching circuit in parallel to the first delay adjustment circuit.

3. The memory interface according to claim 2, wherein the first delay adjustment circuit includes a plurality of stages of delay elements,
the second delay adjustment circuit includes a plurality of stages of delay elements, and
the memory interface further includes a delay stage arithmetic circuit configured to set the number of stages of delay elements in each of the first and second delay adjustment circuits.

4. The memory interface according to claim 3, further comprising:
a switching timing adjustment circuit which is connected in a signal path between the second delay adjustment circuit and the second switching circuit.

5. The memory interface according to claim 1, wherein the first input circuit and the first output circuit are connected to a common terminal for communication with the memory device and are parts of a bi-directional input/output circuit.

6. The memory interface according to claim 1, further comprising:
a second output circuit to be connected to the memory device for communication therewith;
a second input circuit to be connected to the memory device for communication therewith;
a second write circuit configured to process a write strobe;
a second delay adjustment circuit;

a third switching circuit which is connected in a signal path between the second write circuit and the second delay adjustment circuit, and in a signal path between the second input circuit and the second delay adjustment circuit; and a fourth switching circuit which is connected in a signal path between the second delay adjustment circuit and the second output circuit, and in a signal path between the second delay adjustment circuit and the read circuit.

7. The memory interface according to claim 1, further comprising:

a first bypass line which is connected in a signal path between the first switching circuit and the second switching circuit in parallel to the first delay adjustment circuit;

a second bypass line which is connected in a signal path between the first write circuit and the second switching circuit in parallel to the first switching circuit and the first delay adjustment circuit; and a third bypass line which is connected in a signal path between the first input circuit and the second switching circuit in parallel to the first switching circuit and the first delay adjustment circuit, wherein the first switching circuit includes a first selector which has a first input node connected to the first input circuit, a second input node connected to the first write circuit, and an output node connected to an input side of the first delay adjustment circuit and one end of the first bypass line, and the second switching circuit includes
a second selector which has a first input node connected to an output side of the first delay adjustment circuit, a second input node connected to the other end of the first bypass line, and an output node,
a third selector which has a first input node connected to the second bypass line, a second input node connected to the output node of the second selector, and an output node connected to the first output circuit, and
a fourth selector which has a first input node connected to the output node of the second selector, a second input node connected to the third bypass line, and an output node connected to the read circuit.

8. The memory interface according to claim 1, further comprising:

a first bypass line which is connected in a signal path between the first write circuit and the second switching circuit in parallel to the first switching circuit and the first delay adjustment circuit; and a second bypass line which is connected in a signal path between the first input circuit and the second switching circuit in parallel to the first switching circuit and the first delay adjustment circuit, wherein the first switching circuit includes a first selector which has a first input node connected to the first input circuit, a second input node connected to the first write circuit, and an output node connected to an input side of the first delay adjustment circuit, and the second switching circuit includes
a second selector which has a first input node connected to an output side of the first delay adjustment circuit, a second input node connected to one end of the first bypass line, and an output node connected to the first output circuit, and
a third selector which has a first input node connected to the output side of the first delay adjustment circuit, a second input node connected to one end of the second bypass line, and an output node connected to the read circuit.

9. The memory interface according to claim 8, further comprising:

a timing adjustment circuit configured to output a first select signal to the first selector, output a second select signal to the second selector, and output a third select signal to the third selector.

10. The memory interface according to claim 1, wherein when "n" is an integer of 2 or more,
the write data consists of n bits, and
n sets of the first switching circuit, the first delay adjustment circuit, and the second switching circuit are provided.

11. The memory interface according to claim 1, wherein when "n" is an integer of 2 or more,
the read data consists of n bits, and
n sets of the first switching circuit, the first delay adjustment circuit, and the second switching circuit are provided.

12. A memory system, comprising:
a memory device; and
a memory interface, wherein the memory interface comprises
a first output circuit connected to the memory device for communication therewith,
a first input circuit connected to the memory device for communication therewith,
a first write circuit configured to process write data,
a read circuit configured to process read data and a read strobe,
a first delay adjustment circuit,
a first switching circuit which is connected in a signal path between the first write circuit and the first delay adjustment circuit, and in a signal path between the first input circuit and the first delay adjustment circuit, and
a second switching circuit which is connected in a signal path between the first delay adjustment circuit and the first output circuit, and in a signal path between the first delay adjustment circuit and the read circuit.

13. The memory system according to claim 12, wherein the memory interface further comprises:
a second delay adjustment circuit which is connected in a signal path between the first switching circuit and the second switching circuit in parallel to the first delay adjustment circuit.

14. The memory system according to claim 13, wherein
the first delay adjustment circuit includes a plurality of stages of delay elements,
the second delay adjustment circuit includes a plurality of stages of delay elements, and
the memory interface further includes a delay stage arithmetic circuit configured to set the number of stages of delay elements in each of the first and second delay adjustment circuits.

15. The memory system according to claim 14, wherein the memory interface further comprises
a switching timing adjustment circuit which is connected in a signal path between the second delay adjustment circuit and the second switching circuit.

16. The memory system according to claim 12, wherein the first input circuit and the first output circuit are connected to a common terminal for communication with the memory device and are part of a bi-directional input/output circuit.

17. The memory system according to claim 12, wherein the memory interface further comprises a second output circuit connected to the memory device for communication therewith;

a second input circuit connected to the memory device for communication therewith;

a second write circuit configured to process a write strobe;

a second delay adjustment circuit;

a third switching circuit which is connected in a signal path between the second write circuit and the second delay adjustment circuit, and in a signal path between the second input circuit and the first delay adjustment circuit; and a fourth switching circuit which is connected in a signal path between the second delay adjustment circuit and the second output circuit, and in a signal path between the second delay adjustment circuit and the read circuit.

18. A method of adjusting timing of read and write data signals using a memory interface connected to a memory device, the memory interface including a first output circuit connected to the memory device, a first input circuit connected to the memory device, a first write circuit configured to process write data, a read circuit configured to process read data, first and second switching circuits, and a first delay adjustment circuit connected in a signal path between the first and second switching circuits, said method comprising:

at the first switching circuit, receiving write data signals generated by the first write circuit at a first input node and read data signals received from the first input circuit at a second input node and selectively connecting one of the first and second input nodes to an output node;

at the first delay adjustment circuit, delaying one of the read data signals and the write data signals output through the output node of the first switching circuit and outputting the delayed data signals to the second switching circuit; and at the second switching circuit, receiving the delayed data signals from the first delay adjustment circuit at an input node and connecting the input node to one of a first output node connected to the first output circuit and a second output node connected to the read circuit.

19. The method according to claim 18, wherein the memory interface further includes a second delay adjustment circuit connected in a signal path between the first and second switching circuits in parallel to the first delay adjustment circuit.

20. The method according to claim 19, further comprising:

at the first switching circuit, receiving write data signals generated by the first write circuit at a third input node and read data signals received from the first input circuit at a fourth input node and selectively connecting one of the third and fourth input nodes to a second output node;

at the second delay adjustment circuit, delaying one of the read data signals and the write data signals output through the second output node of the first switching circuit and outputting the delayed data signals to the second switching circuit; and at the second switching circuit, receiving the delayed data signals second delay adjustment circuit at a second input node and connecting the second input node to one of the first output node connected to the first output circuit and the second output node connected to the read circuit.

* * * * *